United States Patent
Teutsch et al.

(10) Patent No.: US 7,464,283 B2
(45) Date of Patent: Dec. 9, 2008

(54) SYSTEM AND METHOD FOR PRODUCING PRECISION TIMING SIGNALS BY CONTROLLING REGISTER BANKS TO PROVIDE A PHASE DIFFERENCE BETWEEN TWO SIGNAL PATHS

(75) Inventors: Alexander Noam Teutsch, Murphy, TX (US); Mohammad Al-Shyoukh, Richardson, TX (US); Nicole Cunningham, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 216 days.

(21) Appl. No.: 10/878,341

(22) Filed: Jun. 28, 2004

(65) Prior Publication Data

US 2005/0289379 A1    Dec. 29, 2005

(51) Int. Cl.
*G06F 1/12* (2006.01)
(52) U.S. Cl. .................. 713/500; 324/548; 713/400; 713/401
(58) Field of Classification Search .............. 713/400, 713/401, 500; 324/548
See application file for complete search history.

(56) References Cited

U.S. PATENT DOCUMENTS

| 4,530,107 | A | * | 7/1985 | Williams ............... 377/44 |
| 5,311,486 | A | | 5/1994 | Alton et al. |
| 5,847,588 | A | | 12/1998 | McDermott |
| 6,055,287 | A | | 4/2000 | McEwan |
| 6,075,832 | A | * | 6/2000 | Geannopoulos et al. ..... 375/375 |
| RE37,221 | E | * | 6/2001 | Bowman et al. ......... 363/21.06 |
| 6,243,784 | B1 | | 6/2001 | Anderson et al. |
| 6,259,330 | B1 | * | 7/2001 | Arai ............................ 331/57 |
| 6,414,627 | B1 | | 7/2002 | McEwan |
| 6,445,444 | B2 | | 9/2002 | Dunne |
| 6,462,705 | B1 | | 10/2002 | McEwan |
| 6,498,623 | B1 | | 12/2002 | Anderson et al. |
| 6,636,573 | B2 | | 10/2003 | Richards et al. |
| 6,956,920 | B1 | * | 10/2005 | Veenstra et al. ............. 375/372 |
| 2002/0077763 | A1 | | 6/2002 | Chang et al. |
| 2002/0181622 | A1 | * | 12/2002 | Boutros et al. ............. 375/343 |
| 2002/0194416 | A1 | * | 12/2002 | Kim et al. ................... 710/305 |
| 2003/0131270 | A1 | * | 7/2003 | Abernathy et al. .......... 713/322 |
| 2003/0155953 | A1 | | 8/2003 | Hirata et al. |
| 2003/0208717 | A1 | * | 11/2003 | Klotchkov et al. .......... 714/814 |
| 2004/0071249 | A1 | | 4/2004 | Schell |
| 2004/0207466 | A1 | * | 10/2004 | Anderson et al. ............ 330/10 |

* cited by examiner

*Primary Examiner*—Thomas Lee
*Assistant Examiner*—Albert Wang
(74) *Attorney, Agent, or Firm*—William B. Kempler; W. James Brady, III; Frederick J. Telecky, Jr.

(57) ABSTRACT

Systems and methods are provided for providing precision timing signals. A first register bank, driven by a first clock signal, provides a first delay along a first signal path. A second register bank, driven by a second clock signal related to the first clock signal, provides a second delay along a second signal path. A system control controls at least one of the first and second banks of registers to control the first and second delays, as to provide a desired skew between the output of the first signal path and the second signal path.

22 Claims, 6 Drawing Sheets

US 7,464,283 B2

SYSTEM AND METHOD FOR PRODUCING PRECISION TIMING SIGNALS BY CONTROLLING REGISTER BANKS TO PROVIDE A PHASE DIFFERENCE BETWEEN TWO SIGNAL PATHS

TECHNICAL FIELD

The present invention relates generally to electrical circuits, and more particularly to systems and methods for generating precision timing signals.

BACKGROUND

Producing sets of digital pulses having a desired skew, or delay, between pulses is useful in a variety of applications, including telecommunications, radar, high speed sampling systems and time measurement systems. To be useful for these applications, the skew between the pulses in the set should be known by the system to a high degree of precision. Time measurement systems used for characterizing the timing of the propagation of electromagnetic radiation, such as human-visible light or radio waves through a medium must be exceptionally precise. As an example, an uncertainty of one nanosecond in timing the distance that a radio wave has traveled will result in an uncertainty of 0.3 meters. Accordingly, precision timing circuits have been designed to provide pulse sets with a high degree of precision.

By way of illustration, FIG. 8 depicts an example of a system 1 corresponding to an existing approach that can be utilized to produce a set of pulses PULSE1 AND PULSE2. The system 1 includes a high speed clock 2 and one or more programmable counters 3 and 4 to produce a set of skewed pulses PULSE1 AND PULSE2 for precision timing applications. The counters 3 and 4 are enabled by respective input pulses and are driven by the high speed clock 2. In the system 1, the counter 3 is enabled by an INPUT signal and the counter 4 is enabled by the output of the other counter 3 (PULSE1). Each counter 3, 4 can be programmed to trigger an output pulse PULSE1 AND PULSE2 after a desired number of clock cycles (e.g., based on PROG1 and PROG2, respectively). In a simple radar, time measurement or range finding application, a first pulse can be provided on a first path at a desired interval. For example, the clock 2 can drive the counter 3 having a programmed value representing a desired pulse repetition rate (PRR) for the system 1. Each time the first counter 3 emits PULSE1, the first counter 3 is reset, such that another pulse can be provided at the desired PRR. The second counter 4 can be enabled by the PULSE1 to produce PULSE2 on a second path, with its programmed value representing a desired skew value for the system 1. By controlling the programmed values (PROG1 and PROG2) at the counters 3 and 4, the PRR and the skew of the signal can be varied.

A disadvantage of the above and other existing approaches is the inability to provide pulse repeat intervals greater than the skew between the two paths. For example, in the counter-based implementation described above, both counters must be reset with each pulse from the first counter. Accordingly, if the delay at the receiver path counter is greater than the delay at the transmitter path counter, the receiver path counter will not be able to finish counting down before it is reset by a next transmitter pulse. This limits the range and accuracy of systems utilizing this form of timing as well as the potentially useful applications for such an approach.

SUMMARY

One aspect of the present invention provides a precision timing system. A first register bank, driven by a first clock signal, provides a first delay along a first signal path. A second register bank, driven by a second clock signal related to the first clock signal, provides a second delay along a second signal path. A system control controls at least one of the first and second banks of registers to control the first and second delays, as to provide a desired skew between the output of the first signal path and the second signal path.

Another aspect of the present invention relates to a precision timing system. A clock source provides a first clock signal associated with a first signal path, a second clock signal associated with a second signal path, and a coarse clock signal. A first medium register bank, driven by the first clock signal, provides a pulse along the first signal path having a first delay in response to a first enable signal. A second medium register bank, driven by the second clock signal, provides a pulse along the second signal path having a second delay in response to a second enable signal. A first coarse register bank, driven by the coarse clock signal, provides the first enable signal to the first medium register bank having a third delay relative to the coarse clock signal. A second coarse register bank, driven by the coarse clock signal, provides the second enable signal to the second medium register bank having a fourth delay relative to the coarse clock signal. A system control controls the first and second medium register banks and the first and second coarse register banks to define the respective periods of the first, second, third, and fourth delays.

In accordance with yet another aspect of the present invention, a method is provided for producing precision timing signals. A first input is provided to a selected location of a first bank of shift registers that form part of a first signal path to define a corresponding first delay. A second input is provided to a selected location of a second bank of shift registers that form part of a second signal path to define a corresponding second delay. The first bank of shift registers is driven with a first signal clock to shift the first input through the first bank of shift registers to provide an output associated with the first signal path. The second bank of shift registers is driven with a second signal clock, which is related to the first signal clock, to shift the second input through the second bank of shift registers to provide an output associated with the second signal path.

BRIEF DESCRIPTION OF THE DRAWINGS

The foregoing and other aspects of the present invention will become apparent to those skilled in the art to which the present invention relates upon reading the following description with reference to the accompanying drawings.

DETAILED DESCRIPTION

Figure 1:
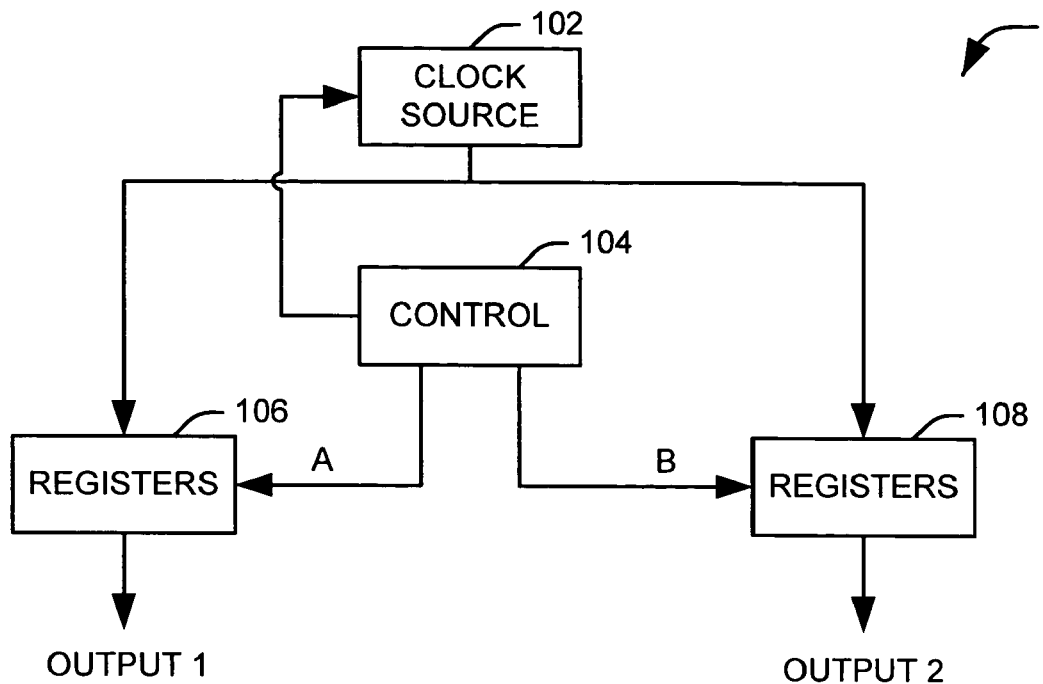
FIG. 1 illustrates a precision timing system in accordance with an aspect of the present invention.
Figure 8:
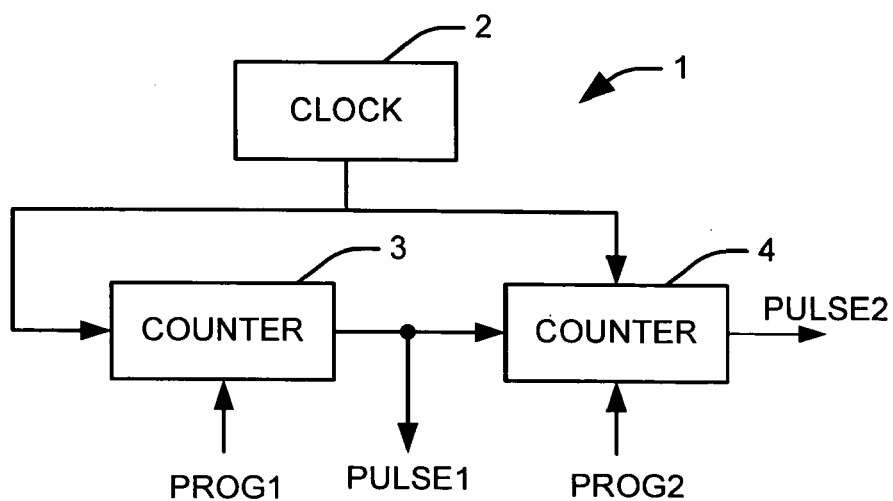
FIG. 8 illustrates a conventional approach for generating timing pulses.

FIG. 1 illustrates a precision timing system 100 in accordance with an aspect of the present invention. The precision timing system 100 includes a clock source 102 that provides one or more high-speed clock signals (e.g., in the upper MHz or GHz range). In an exemplary embodiment, the clock 102 can comprise a digital phase locked link circuit operative to produce one or more clock signals having different clock rates and/or phases. For example, the clock source 102 can include produce two signals at the same frequency that vary in phase. Additionally, dividers can be employed to produce clock signals of different frequencies. A system control 104 can control one or more of the clock frequencies and the phase shifts of the various signals output from the respective signal paths, which outputs are indicated at OUTPUT 1 and OUTPUT 2.

The clock signals produced by the clock source 102 can be used to drive one or more register banks 106 and 108 on each of a plurality of signal paths. The system control 104 can control the register banks 106 and 108 to implement a desired skew between OUTPUT 1 and OUTPUT 2. For example, the system control 104 can selectively load the register banks 106 and 108 to set the number of registers that a given signal pulse will be shifted through prior to being output. Accordingly, the system control 104 can define a desired delay implemented at each register bank 106 and 108 in increments of a full clock cycle, with the difference in their delays providing a corresponding skew for the system outputs OUTPUT 1 and OUTPUT 2. By using multiple register banks on each signal path and clock signals of multiple frequencies, it will be appreciated that different increments of delay can be implemented by selectively controlling each of the respective banks. Even finer increments of delay can be achieved by the system control 104 varying the relative phase of the driving clock signals provided by the clock source 102 to the register banks 106 and 108.

The system 100 can produce skews between the signal paths that exceed the PRR of the first signal path. It will be appreciated that multiple pulses can be shifted through a given register bank at any given time, allowing the resolution of a first pulse set to be achieved even after a second pulse set has been initiated. This occurs, for example, when the delay on the second path has a duration twice that of the delay imposed on the first path. It will further be appreciated that the loading of the register banks 108 and 108 can be implemented as a multiplexer or similar device that can be controlled dynamically by the system control 104. Accordingly, PRR and skew of the system 100 can be adjusted dynamically, making the system 100 well-suited for applications requiring rapid changes in the PRR and skew, such as spread spectrum radar.

Figure 2:
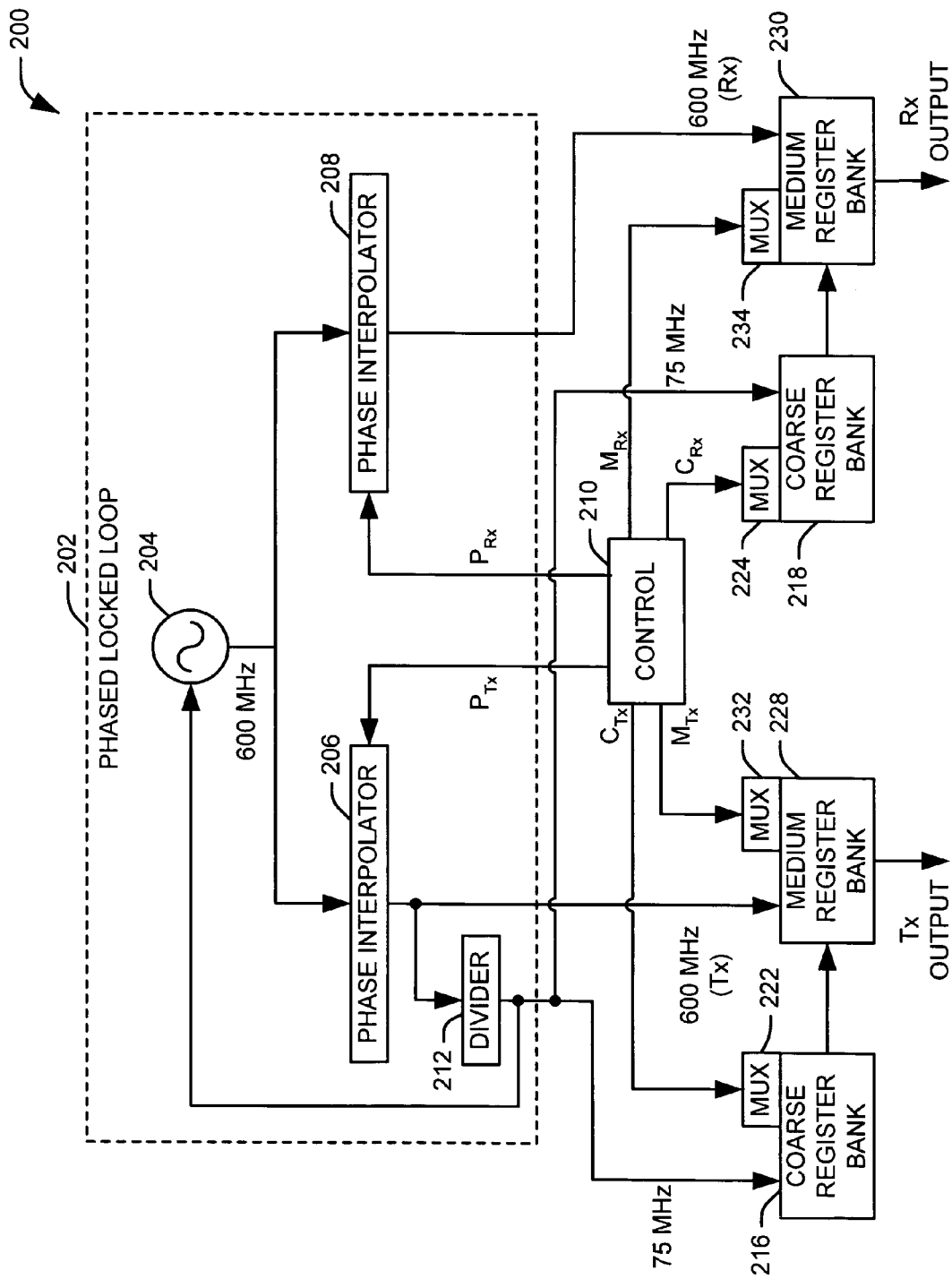
FIG. 2 illustrates a functional block diagram of an exemplary precision timing system in accordance with an aspect of the present invention.

FIG. 2 illustrates a functional block diagram of an exemplary precision timing system 200 in accordance with an aspect of the present invention. In the illustrated system, reference timing for the system is provided by a phased locked loop (PLL) 202 that provides one or more clock signals for the system. In the illustrated example, the PLL 202 includes a reference clock operating at about 600 MHz. Using this reference, the system 200 can produce a skew between its two output paths having a resolution of approximately 104 picoseconds. For the purposes of illustration, the precision timing system 200 will be discussed in the context of a spread spectrum radar application. Accordingly, a first signal path will be referred to as the transmitter (Tx) path, and a second signal path, which is delayed relative to the transmitter path, will be referred to as the receiver (Rx) path. It will be appreciated, however, that the illustrated example is not limited to a radar application and can be utilized in a variety of applications requiring the generation of precisely timed signals.

The PLL 202 includes a digital oscillator 204 that provides a clock signal at 600 MHz. This signal is provided along both the transmitter and the receiver paths to respective phase interpolators 206 and 208. The phase interpolators 206 and 208 allow a desired phase shift of to be inserted with respect to one or both of the receiver path and transmitter path signals. For example, the phase interpolators 206 and 208 can produce phase shifts in their respective signals in increments of one-sixteenth of a cycle (e.g., about 104 picoseconds). The phase shift applied at the phase interpolators 206 and 208 can be controlled via respective control inputs, $P_{Tx}$ and $P_{Rx}$, provided from a system control 210. The control inputs $P_{Tx}$ and $P_{Rx}$ can have any word length sufficient to achieve a desired amount of phase shift in the respective transmitter and receiver signal paths The phase interpolator 206 provides a phase shifted clock signal to a divider 212. The divider 212 provides another clock signal at a reduced rate (e.g., 75 MHz) relative to the phase shifted clock signal from the interpolator 206. The reduced clock signal output from the divider 212 is provided back to the oscillator 204 within the phase locked loop 202 as a feedback signal. The divider 212 also provides the reduced clock signal to drive two shift register banks 216 and 218 that are utilized to provide coarse delay within the transmitter and the receiver signal paths, respectively. For example, each bank of shift registers (e.g., 216, 218) can include a plurality of (e.g., seventy-two) shift registers connected in series. It will be appreciated that each register in the series represents one cycle (e.g., about 13.3 nanoseconds) of delay, and that a given register bank (e.g., 216, 218) can be used to provide a maximum delay of up to seventy-two clock cycles (0.96 milliseconds). It will be appreciated that the resolution and maximum for the delay can be adjusted by utilizing a different number of registers in the respective banks and/or the frequency of the clock signal.

A logic high input can be provided to the coarse register bank 216 at any point along the series of registers via an associated multiplexer 222. The multiplexer 222 selects an appropriate register to receive the logic high input according to a control input $C_{Tx}$ from the system control 210. The control input $C_{Tx}$ represents a coarse portion of a desired delay to be provided to the transmitter path signal. Similarly, a logic high input can be provided to the Rx coarse register bank 218 at any point along the series via an associated multiplexer 224. The multiplexer 224 selects an appropriate register to receive the logic high input according to a control input $C_{Rx}$ from the system control 210 representing a coarse portion of a desired delay to be provided to the receiver path signal.

An enable signal can be provided simultaneously to both coarse register banks 216 and 218 to allow their respective inputs to be shifted into the selected registers at the next clock signal. It will be appreciated that the control inputs $C_{Tx}$ and $C_{Rx}$ can be selected to produce a delay, in increments of the clock period, between the output of the Tx register bank 216 and the Rx register bank 218. It will further be appreciated that the control input $C_{Tx}$ can be utilized to provide an output from the Tx register bank at desired intervals. The system 200 is particularly well suited for spread spectrum radar applications, where the interval between transmitter signal pulses can be varied by providing suitable values for $C_{Tx}$ through the system control 210. Those skilled in the art will appreciate that $C_{Rx}$ can be moved with $C_{Tx}$ to help maintain the desired skew between Tx/Rx outputs.

The outputs of the coarse register banks 216 and 218 are provided to respective medium register banks 228 and 230 as an enable signal. The medium register banks 228 and 230 receive the outputs of the Tx phase interpolator 206 and the Rx phase interpolator 208, respectively, as clock signals. It will be appreciated that the clock signal received from the Rx phase interpolator 208 can be delayed with respect to the Tx phase interpolator 206, such that the registers in the Rx medium register bank 230 will be shifted with a slight delay relative to those in the Tx medium register bank 228. In the illustrated example, each of the medium register banks (e.g., 228, 230) comprises eight shift registers connected in series. It will be appreciated that each register in the series represents one cycle, such as approximately 1.67 nanoseconds, of delay, and that a given register bank (e.g., 228, 230) can be used to provide a maximum delay of up to eight clock cycles (e.g., about 13.3 nanoseconds), which is equal to one cycle in the coarse register. It will be appreciated that the resolution and maximum for the delay can be adjusted by changing the number of registers in the banks and/or the frequency of the clock signal, but to provide a full range of resolution, the maximum delay should be at least equal to the period of the clock associated with the coarse register banks 216 and 218.

A logic high input can be provided to the Tx medium register bank 228 at any point along the series via an associated multiplexer 232. The multiplexer 232 selects an appropriate register to receive the input according to a control input $M_{Tx}$ from the system control 210 representing a portion of a desired delay to be provided to the transmitter path signal. When the enable signal is output from the Tx coarse register bank 216, the input is shifted into the Tx medium register bank 228 based on the control input $M_{Tx}$. The input proceeds through the medium register bank 228 generally depending on the cycle time of the input clock signal (e.g., 600 MHz) provided by the phase interpolator 206. The output of the Tx medium register bank 228 provides the Tx output.

Similarly, a logic high input can be provided to the Rx medium register bank 230 at any point along the series via an associated multiplexer 234. The multiplexer 234 selects an appropriate register to receive the logic high input according to a control input $M_{Rx}$, which is provided from the system control 210. The control input $M_{Rx}$ represents a portion of a desired delay to be provided to the receiver path signal. When the enable system is output from the Rx coarse register bank 218, the input is shifted into the Rx medium register bank 230 based on the control input $M_{Rx}$. The input then proceeds through the medium register bank 230 according to the cycle time of the clock signal (e.g., 600 MHz) provided by the phase interpolator 208. It will be appreciated that both the enable signal from the Rx coarse register bank 216 and the Rx clock signal from the Rx phase interpolator 208 can be delayed relative to the corresponding signals on the Tx path. The output of the Rx medium register bank 230 provides the Rx output.

It will be appreciated that the delay between the Rx output and the Tx output can vary based on the control signals provided by the system control 210. For example, large amounts of delay (a coarse range of delay) can be implemented by varying the control inputs $C_{Tx}$ and $C_{Rx}$ for the coarse register banks 216 and 218. A medium range of delays can be applied by varying the values for the control inputs $M_{Tx}$ and $M_{Rx}$ to the medium register banks 228 and 230. The range of delays can range from the period of the phase shifted clock signal from the interpolator 206, 208 to a multiple of such period that is functionally related to the number of registers in the medium register bank 228, 230. For example, if there are eight registers in the medium register banks 228 and 230 with the phase shifted clock signal from the interpolators provided at 600 MHz, the medium range of delay ranges from about 0 to about 1.333 ns.

A fine range of delay can be applied by varying the control words $P_{Tx}$ and $P_{Rx}$ provided to the phase interpolators 206 and 208. The fine range of delay can correspond to fractional portion of the period of the clock signal from the clock source 204. For instance, the phase interpolators 206 and 208 afford delays of less than one period of the phase shifted clock from the interpolators 206 and 208 to be added, such as in increments of one-sixteenth of a period.

The total delay, or skew, (Δ) between the output signals Tx OUTPUT and Rx OUTPUT can thus be expressed as:

$$\Delta = (P_{Rx} - P_{Tx}) * T_{MED}/16 + (M_{Rx} - M_{Tx}) * T_{MED} + (P_{Rx} - P_{Tx}) * T_{CRS} \qquad \text{Eq.1}$$

Where:
Δ is the delay between the Tx output and the Rx output,
$T_{MED}$ is the common period of the clock signal driving the medium register banks 228 and 230, and
$T_{CRS}$ is the period of the clock signal driving the coarse register banks 216 and 218.

The parameters associated with the transmitter path can also be controlled to vary the timing between transmitter pulses. For example, if the Tx output is feedback as the enable signal to the coarse register banks 216 and 218, it will be appreciated that the timing between Tx outputs can be precisely controlled according to the values provided for the various control outputs $P_{Tx}$, $M_{Tx}$, and $C_{Tx}$ associated with the transmitter path. Since these control output parameters are programmable in real-time, the system control 210 can dynamically vary their values to change the frequency of the Tx output. This can be valuable in spread spectrum radar applications to disperse the energy of the Tx outputs across a given spectral band.

Figure 3:
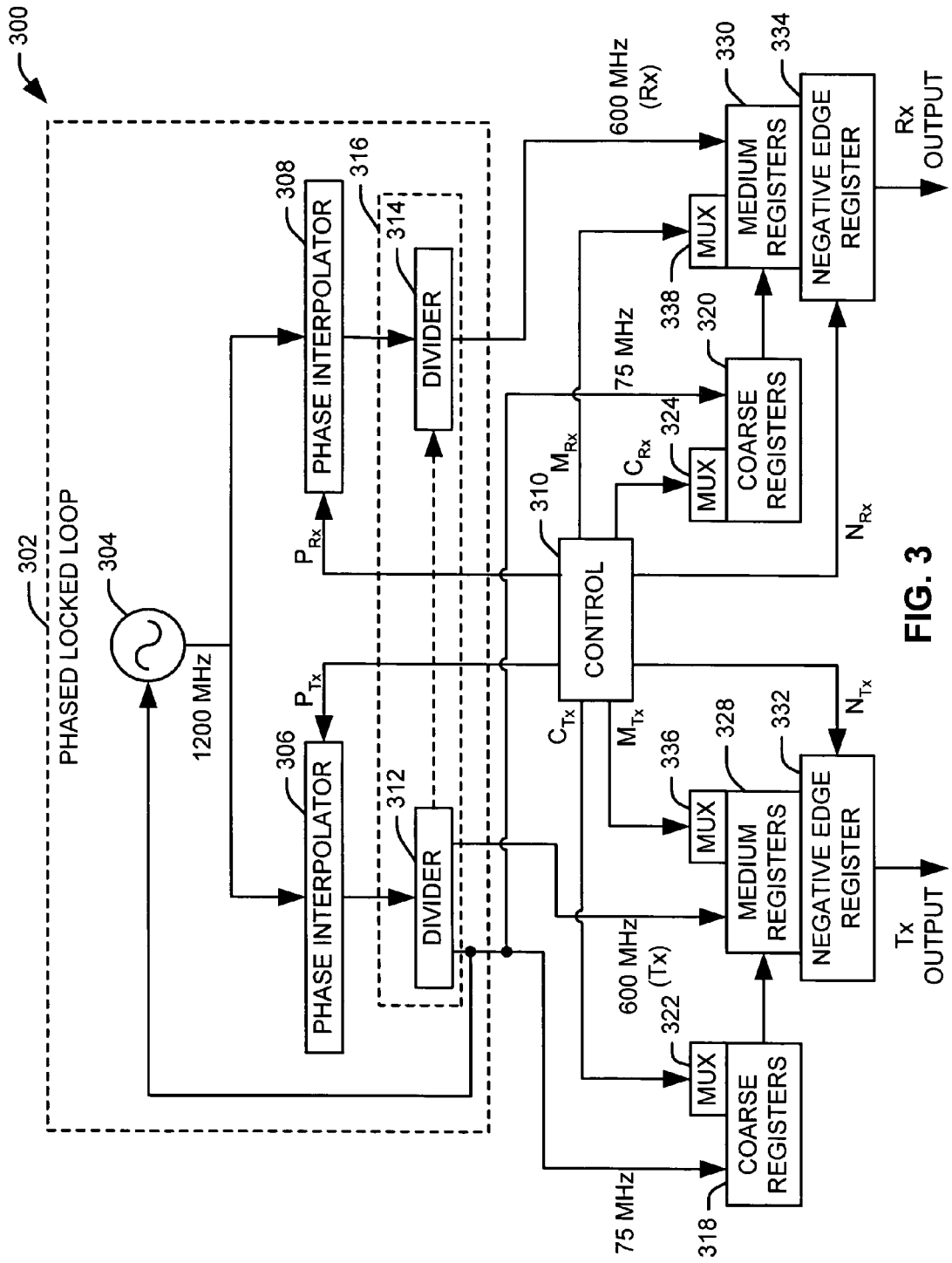
FIG. 3 illustrates a functional block diagram of a second exemplary precision timing system in accordance with an aspect of the present invention.

FIG. 3 illustrates a functional block diagram of a second exemplary precision timing system 300 in accordance with an aspect of the present invention. In the illustrated system 300, reference timing for the system is provided by a phased locked loop (PLL) 302 configured to provide one or more clock signals for the system. In the illustrated example, the phase locked loop 302 utilizes a reference clock operating at approximately 1200 MHz. Using this reference, the system 300 can produce a skew between its two output paths having a resolution of approximately 52 picoseconds. For the purposes of illustration, the precision timing system 300 will be discussed in the context of a spread spectrum radar application. Accordingly, a first signal path will be referred to as the transmitter (Tx) path, and a second signal path, which is delayed relative to the transmitter path, will be referred to as the receiver (Rx) path. It will be appreciated, however, that the illustrated example is not limited to a radar application and can be utilized in a variety of applications requiring the generation of precisely timed signals.

The PLL 302 includes a digital oscillator 304 that provides a clock signal at approximately 1200 MHz. This clock signal is provided along both the transmitter and the receiver paths to respective phase interpolators 306 and 308. The phase interpolators 306 and 308 allow a desired phase shift of to be inserted between the receiver path and transmitter path signals. In the illustrated example, the phase interpolators 306 and 308 can produce phase shifts in their respective signals in desired increments of a cycle (e.g., one-sixteenth of a cycle or about 52 picoseconds). The phase shift applied at the phase interpolators 306 and 308 can be controlled via respective control inputs $P_{Tx}$ and $P_{Rx}$ from a system control 310.

The outputs of the phase interpolators 306 and 308 are provided to respective dividers 312 and 314 within a locked divider apparatus 316. Each divider 312 and 314 can operate as a standard divide-by-two to produce a fractional (one-half) representation of the input signal. Accordingly, the Tx path divider 312 outputs a transmitter clock signal operating at 600 MHz, and the Rx path divider outputs a receiver clock signal, operating at 600 MHz. The two outputs retain the phase difference of the original reference signals imposed by the respective phase interpolators 306 and 308, but the locked divider apparatus 316 coordinates the operation of the dividers 312 and 314 to lock their output in phase and maintain a desired phase difference. The Tx divider 312 can also be operative to produce a coarse clock signal (e.g., operating at 75 MHz), such as by implementing an additional divide-by-two. The divider feeds the coarse clock signal back to the oscillator 304 within the phase locked loop 302.

The divider also provides the coarse clock signal to drive two shift register banks 318 and 320 utilized to provide coarse delay within the transmitter and the receiver signal paths, respectively. In the illustrated example, each bank of shift registers (e.g., 318, 320) comprises a plurality of shift registers connected in series to provide a desired incremental coarse delay, such as including seventy-two shift registers. It will be appreciated that each register in the series represents one cycle of the coarse clock, or 13.3 nanoseconds, of delay, and that a given register bank (e.g., 318, 320) can be used to provide a maximum delay of up to seventy-two clock cycles (0.959 μs). It will further be appreciated that the resolution and maximum for the delay can be adjusted by changing the number of registers in the banks and/or the frequency of the clock signal.

A logic high input can be input to the Tx coarse register bank 318 at any point along the series of registers via an associated multiplexer 322. The multiplexer 322 selects an appropriate register to receive the logic high input according to a control input $C_{Tx}$ from the system control 310 representing a coarse portion of a desired delay to be provided to the transmitter path signal. Similarly, a logic high input can be provided to the Rx coarse register bank 320 at any point along the series of registers via an associated multiplexer 324. The multiplexer 324 selects an appropriate register to receive the logic high input according to a control input $C_{Rx}$ from the system control 310 representing a coarse portion of a desired delay to be provided to the receiver path signal.

An enable signal can be provided simultaneously to both coarse register banks 318 and 320 to allow their respective logic high inputs to be shifted into the selected registers at the next clock signal. It will be appreciated that the control inputs $C_{Tx}$ and $C_{Rx}$ can be selected to produce a desired range of coarse delay, in increments of the coarse clock period, between the output of the Tx register bank 318 and the Rx register bank 320. It will further be appreciated that the control input $C_{Tx}$ can be utilized to provide an output from the Tx register bank at desired intervals.

The outputs of the coarse register banks 318 and 320 are provided to respective medium register banks 328 and 330 as respective enable signals. The medium register banks 328 and 330 receive the divided (e.g., 600 MHz) outputs of the Tx phase interpolator 306 and the Rx phase interpolator 308, respectively, as clock signals. It will be appreciated that the clock signal provided by the Rx phase interpolator 308 can be delayed with respect to the clock signal provided by Tx phase interpolator 306, such that the input signal to the registers in the Rx medium register bank 330 will be shifted with a slight delay relative to those in the Tx medium register bank 328. For example, the phase control inputs $P_{Tx}$ and $P_{Rx}$ to the phase interpolators 306 and 308 can be used to implement a delay of up to one-half cycle of the 600 MHz reference clock between the outputs of the medium register banks 328 and 330.

In the illustrated example, each of the medium register banks (e.g., 328, 330) can include a plurality of (e.g., eight) shift registers connected in series and respective negative edge registers 332 and 334. It will be appreciated that each of the eight registers in the series corresponds to one cycle of delay (approximately 1.67 nanoseconds), and that a given register bank (e.g., 328, 330) can be used to provide a maximum delay of up to eight clock cycles (about 13.3 nanoseconds), which is equal to about one cycle in the coarse register.

The negative edge registers 332 and 334 can be clocked off the falling edge of the signal to provide an additional half cycle delay. Respective multiplexers (not shown) associated with the negative edge registers 332 and 334 can select either the original output of their associated medium register bank (e.g., 328, 330) while running off of rising edge of clock. Alternatively, the multiplexers can select the additional half-cycle delayed output of the negative edge register (e.g., 332, 334). It will be appreciated that the fine phase delay available over one-half cycle of the 600 MHz clock provided by the phase interpolators 306 and 308 can be used in conjunction with the half-cycle delay provided by the negative edge registers 332 and 334 to enable any range of delay to be selected over the period of the 600 MHz clock without a loss of resolution.

A logic high input can be provided to the Tx medium register bank 328 at any point along the series via an associated multiplexer 336. The multiplexer 336 selects an appropriate register to receive the logic high input according to a control input $M_{Tx}$ from the system control 310 representing a portion of a desired delay to be provided to the transmitter path signal. When the enable signal is output from the Tx coarse register bank 318, the input is shifted into a desired register of the Tx medium register bank 328 based on the control input $M_{Tx}$. The input proceeds through the medium register bank 328 according to its clock cycle. The output of the Tx medium register bank 328 is provided to the Tx negative edge register 332, where the output is either provided as a Tx output or delayed by a further half cycle, depending on a control bit $N_{Tx}$ provided by the system control 310.

Similarly, a logic high input can be provided to the Rx medium register bank 330 at any point along the series of registers via an associated multiplexer 338. The multiplexer 338 selects an appropriate register to receive the logic high input according to a control input $M_{Rx}$ from the system control 310. The control input $M_{Rx}$ represents a value indicative of a portion of a desired delay to be provided to the receiver path signal. When the enable signal is output from the Rx coarse register bank 320, the input is shifted into the Rx medium register bank 330 based on the control input $M_{Rx}$. The input then proceeds through the medium register bank 330 according to its clock cycle. It will be appreciated that both the enable signal from the Rx coarse register bank 320 and the Rx clock signal can be delayed from the corresponding signals on the Tx path. The output of the Rx medium register bank 330 is provided to the Rx negative edge register 334, where the output is either provided as a Rx output or delayed by a further half cycle, depending on a control bit $N_{Tx}$ provided by the system control 310. The output of the negative edge register 334 provides the Rx output.

It will be appreciated that the delay between the Rx output and the Tx output can be determined from the control signals provided by the system control 210. Large amounts of delay can be implemented between the Rx output and the Tx output by varying the control inputs $C_{Tx}$ and $C_{Rx}$ for the coarse register banks 318 and 320. A medium range of delays, ranging from the period of the reference clock to the period of the coarse clock signal can be implemented by varying the values for the control inputs $M_{Tx}$ and $M_{Rx}$ to the medium register banks 328 and 330. A fine range of delay can be applied by varying the control words $P_{Tx}$ and $P_{Rx}$ provided to the phase interpolators 306 and 308 and the respective control bits $N_{Tx}$ and $N_{Rx}$ regulating the negative edge registers 332 and 334. Used in concert, the phase interpolators 306 and 308 and the negative edge detectors 332 and 334 can be used to provide delays of less than one period of the 600 MHz clock to be added, with a resolution of one thirty-second of a period. The total delay (or skew) Δ between the output signals Tx output and the Rx output can thus be expressed as:

$$\Delta = (P_{Rx} - P_{Tx}) * T_{MED}/16 + (N_{Rx} - N_{TX}) * T_{MED}/2 + ((M_{Rx} - M_{Tx}) * T_{MED} + (P_{Rx} - P_{Tx}) * T_{CRS} \quad \text{Eq. 2}$$

where

Δ is the delay between the Tx output and the Rx output, $T_{MED}$ is the common period of the clock signal driving the medium register banks 328 and 330, and $T_{CRS}$ is the period of the clock signal driving the coarse register banks 318 and 320.

The delay structure within the transmitter path can also be used to vary the timing between transmitter pulses. For example, if the Tx output is fed back as the enable signal to the coarse register banks 318 and 320, it will be appreciated that the timing between Tx outputs can be more precisely controlled according to the values provided for the various control outputs $N_{Tx}$, $P_{Tx}$, $M_{Tx}$, and $C_{Tx}$, associated with the transmitter path. Since these values are programmable in real-time, the system control 310 can dither the time between consecutive transmit pulses by varying insertion location, while maintaining a desired Tx–Rx skew for range accuracy with transmitter time dithered. This can be valuable in spread spectrum radar and other applications to disperse the energy of the Tx outputs across a given spectral band.

Figure 4:
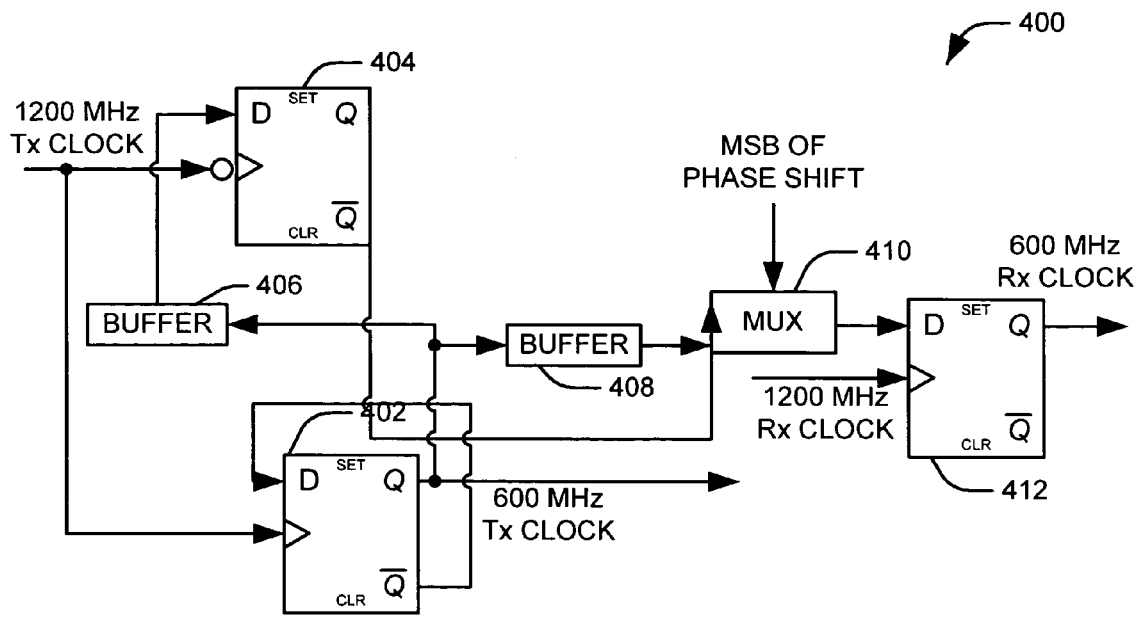
FIG. 4 illustrates a block diagram of an exemplary implementation of a locked divider apparatus in accordance with an aspect of the present invention.

FIG. 4 illustrates a block diagram of an exemplary implementation of a locked divider apparatus 400 for generating phase-locked, divided signals from a transmitter reference clock signal and a receiver reference clock signal. In the exemplary implementation, the two reference clock signals have a common frequency (e.g., about 1200 MHz) and can be shifted in phase accordingly to the operation of respective phase interpolators, such as described herein. It will be appreciated that this frequency value is merely exemplary and that other values can be used in accordance with the present invention. The outputs of the divider apparatus 400 are a divided transmitter clock signal and a divided receiver clock signal, each running at one-half the common frequency of the original reference signals. It will be appreciated that the two outputs will retain the phase difference of the original reference signals, but will be locked in phase to maintain the desired phase difference.

A transmitter reference clock signal is provided as a clock input to a first flip-flop 402 and a second flip-flop 404. The first flip-flop 402 has its negative output fed back to its input in a typical divide-by-two arrangement. Accordingly, the output of the first flip-flop 402 provides an output signal, in phase with the transmitter reference clock, at half the reference frequency (e.g., 600 MHz). The divided signal can be utilized as a reference clock for a transmitter path in the timing system described above.

The output of the first flip-flop 402 is provided to each of first and second buffers 406 and 408. The buffers 406 and 408 are used to maintain synchronicity of the divided signal between their respective processing paths. The output of the first buffer is fed to the input of the second flip-flop 404. The second flip-flop 404 is driven by the falling edge of the transmitter reference clock signal. Accordingly, the negated output $\overline{Q}$ is substantially identical to the input, but is shifted forward by one-half cycle of the reference clock, or one-quarter cycle of the divided clock (e.g., about 600 MHz) provided from the output of flip-flop 402. Accordingly, the output of the second flip-flop 404 is approximately the 600 MHz output of the first flip-flop 402 delayed by a quarter cycle of the 600 MHz.

The output of the second flip-flop 404 is provided as a first input to a multiplexer 410. The output of the second buffer 408 is provided as a second input to the multiplexer. The two inputs thus represent the divided transmitter clock signal from the first flip-flop 402 and a quarter-cycle delayed representation of the signal. A control bit is provided to the multiplexer 410 based upon the difference in phase between the original transmitter reference clock signal and a receiver reference clock signal. Referring back to FIG. 3, this value corresponds to the difference between the control words $P_{Tx}$ and $P_{Rx}$ provided to the phase interpolators 306 and 308. The most significant bit (MSB) of this difference is provided as the control bit to the MUX 410. As a result, if the phase difference is less than half the cycle of the reference clocks (e.g., 1200 MHz), the original divided signal from the first flip-flop 402 is selected. If the phase is greater than half a cycle, the delayed signal from the second flip-flop 404 is selected based on the MSP control input to the MUX 410.

The multiplexer 410 provides its output to a third flip-flop 412. The third flip-flop 412 is driven by the receiver reference clock signal, which as discussed above, can be a phase delayed representation of the transmitter reference signal. If the phase difference is small (e.g., zero to one-half cycle), the divided transmitter clock signal, which operates at half the frequency of the receiver reference clock, will have the same value as a desired divided receiver clock signal at each rising edge of the receiver reference clock despite the difference in phase. Thus, the multiplexer 410 provides the divided transmitter clock signal to the third-flip flop 412, which outputs an appropriately delayed signal with each rising edge of the receiver reference clock.

If the phase difference between the two reference clocks is large (greater than one-half period), the desired divided receiver clock with correspond in value to the quarter cycle delayed representation of the divided transmitter clock signal. Accordingly, the multiplexer 410 selects the output from the flip-flop 404 to provide the delayed representation of the divided transmitter clock signal to the third-flip flop 412. The third flip-flop then outputs an appropriately delayed signal with each rising edge of the receiver reference clock. It will be appreciated that the above described apparatus allows the divided transmitter clock signal and the divided receiver clock signal to remain locked in phase while retaining the phase difference applied to the original transmitter and receiver reference signals.

Figure 5:
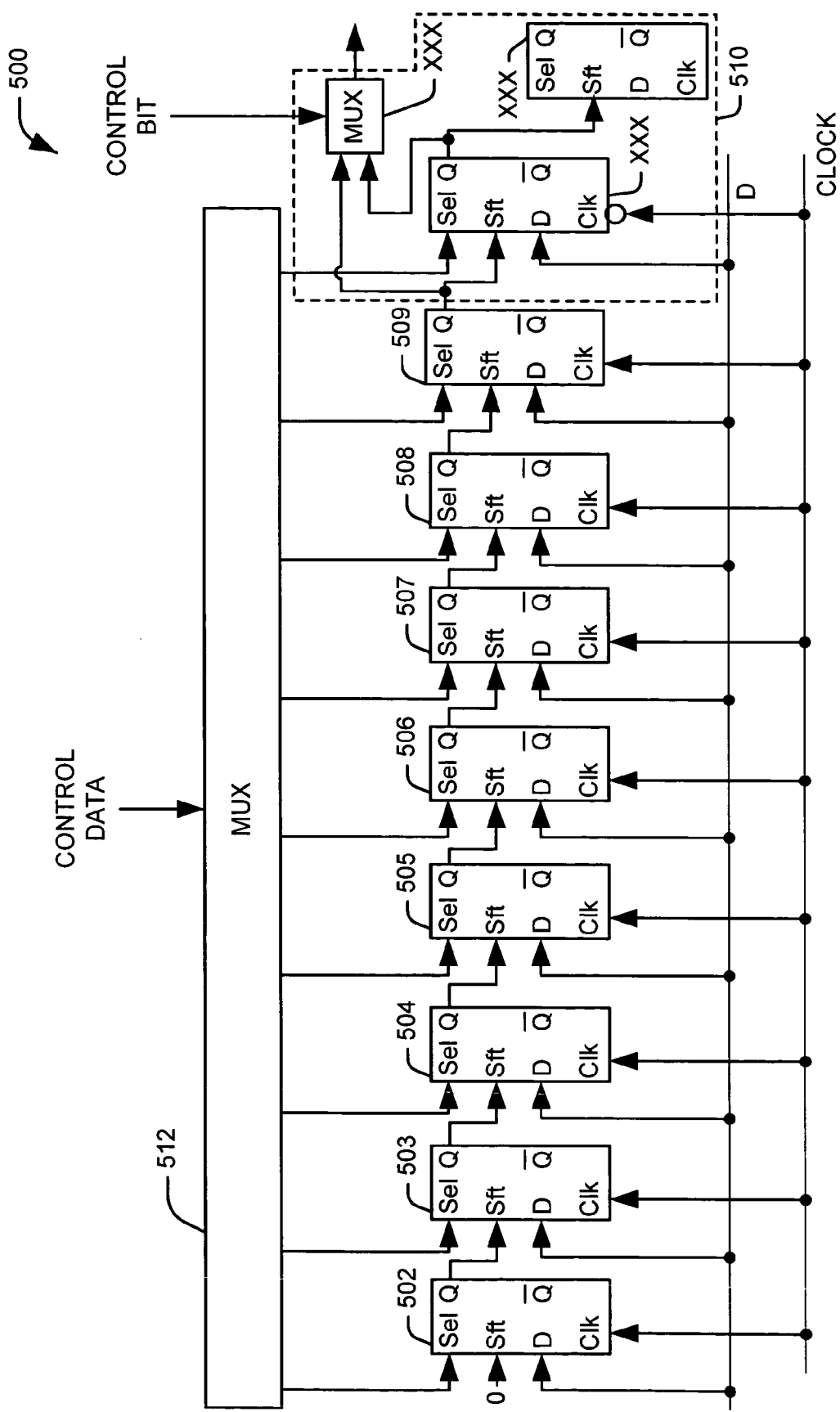
FIG. 5 depicts an exemplary medium register bank in accordance with an aspect of the present invention.

FIG. 5 depicts an example of a register bank 500 that can be utilized in accordance with an aspect of the present invention. The register bank 500 can be employed to provide a medium range of delay in a precision timing generation system. The illustrated register bank 500 utilizes an "eight-plus-one" arrangement, in which eight registers 502-509 are driven off the leading edge of a clock cycle to produce full cycle delays, and a negative edge register 510 is clocked of the falling edge of a clock cycle to provide a corresponding delay of one-half cycle. It will be appreciated that the use of the negative edge register provides significant advantages. For example, to achieve the range of delay and resolution of the "eight plus one" arrangement without the negative edge register 510 for a given clock speed, it would be necessary to implement sixteen registers and double the associated clock speed, increasing the complexity, cost and power consumption of the system.

During operation, control data is provided to a multiplexer 512 associated with the medium register bank 500 representing a desired delay to be implemented at the register bank 500. In response to a control data input (e.g., a four-bit word), the multiplexer 512 provides a respective outputs to selected inputs of the various registers 502-509. The selection input operates to control whether a given register should accept the "shift" input from the previous register or accept a new logic high signal, "D" at the next clock pulse. Normally, the medium register bank 500 operates as a shift register, with the first register 502 receiving a null input and each following register 503-509 assuming the input of the prior register. To enter a new pulse into the system, the multiplexer 512 selects a register (e.g., 506) according to a desired number of clock cycles of delay, and instructs the selected register to accept the "D" input at the next clock cycle. The logic high at that register (e.g., 506) is then passed along the series of registers until it reaches the final register 509.

When the final register in the series 509 is at logic high, it provides its output to the negative edge register 510, including to a negative shift register 512 and a multiplexer 514 thereof. The negative shift register 512 is driven by an inverted clock signal, such that it shifts on the falling edge of the clock. Accordingly, a state will be provided to the negative shift register 512 at the rising edge of a cycle and will be shifted out of the register on the falling edge of the cycle, providing one-half cycle of delay. The output of the negative shift register 512 is provided to the multiplexer 514. The output is also provided to a dummy register 516 to equalize the capacitive properties of the negative shift register 512 and the remaining registers 502-509, thereby simplifying the implementation of the register bank 500.

The multiplexer 514 selects between the output of the final register 509 and the negative shift register 512 according to a control bit that indicates if an additional half-cycle of delay is required to produce a desired phase delay in the signal. In an exemplary implementation, the control bit at the multiplexer represents the most significant bit (MSB) of a control word representing a desired phase shift. The MSB of the control word can be provided to the multiplexer 514 as the control bit for implementing an additional half-cycle of delay, while at least the remaining portion of the control word is provided to a phase interpolator (See $P_{Tx}$ and $P_{Rx}$ in FIG. 3) to produce a corresponding fine phase shift associated with the signal. It will be appreciated that the resolution of the phase shift can be effectively doubled by limiting the range of the fine phase shift to one-half cycle and adding a half cycle of delay at the negative edge register as described herein.

Figure 6:
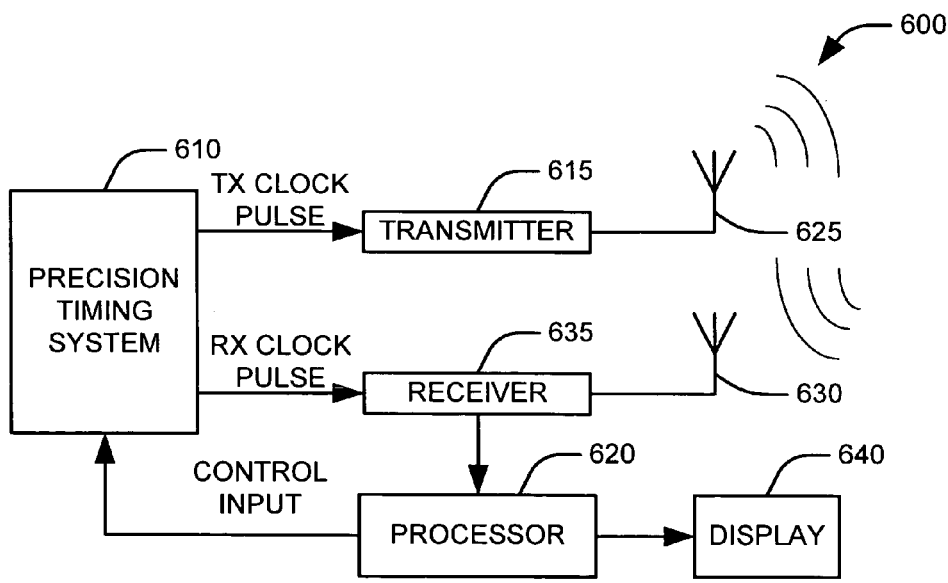
FIG. 6 illustrates a schematic diagram of an exemplary spread-spectrum radar system incorporating a precision timing system in accordance with an aspect of the present invention.

FIG. 6 illustrates a schematic diagram of an exemplary spread-spectrum radar system 600 incorporating a precision timing system 610 in accordance with an aspect of the present invention. It will be appreciated, however, that this implementation is merely exemplary to show but one possible use of the precision timing system and that the timing system of the present invention can be applied to other applications. The precision timing system 610 provides transmitter clock pulses to drive a transmitter 615 according to control input from a processor 620. The transmitter 615 produces an appropriate radar signal according to the clock pulse and transmits the signal via one or more transmission antennas 625. The one or more antennas 625 can be directional as to allow transmissions of a radar pulse toward a particular region or target of interest. It will be appreciated that the processor 620 can be operative to dither the frequency of the transmitted pulses in real time to allow the pulses to vary in frequency. Accordingly, the energy transmitted from the radar system 600 can be spread over a desired range of frequencies. It will be further appreciated that the processor 620 can alter the skew (e.g., delay between transmit and receive pulses) based on control input to the precision timing system 610 so as to change the range of the radar.

One or more receiving antennas 630 receive echoes of the signals radiated by one or more transmission antennas 625 and provide the received signals to a receiver 635. The receiver 635 isolates the useful portion of the received echoes as a plurality of samples according a receiver reference signal from the precision timing system 610. As discussed above, the receiver reference signal is delayed by a desired period, referred to as the skew of the radar, to allow for the propagation time of the echoes. A range for the radar can be set by adjusting the skew, essentially setting a desired travel distance for the echoes. It will be appreciated that, in accordance with the present invention, the skew of the radar can exceed the repetition rate of the pulses. The receiver 635 outputs the samples to the processor 620 which analyzes the received signals to determine the position and/or velocity of any objects with the scanned area. The determined positions and velocities can be provided to a human operator via a display or other output device 640. Those skilled in the art will understand and appreciated various implementations of transmitters and receivers and antenna structures that can be implemented in the radar system.

Figure 7:
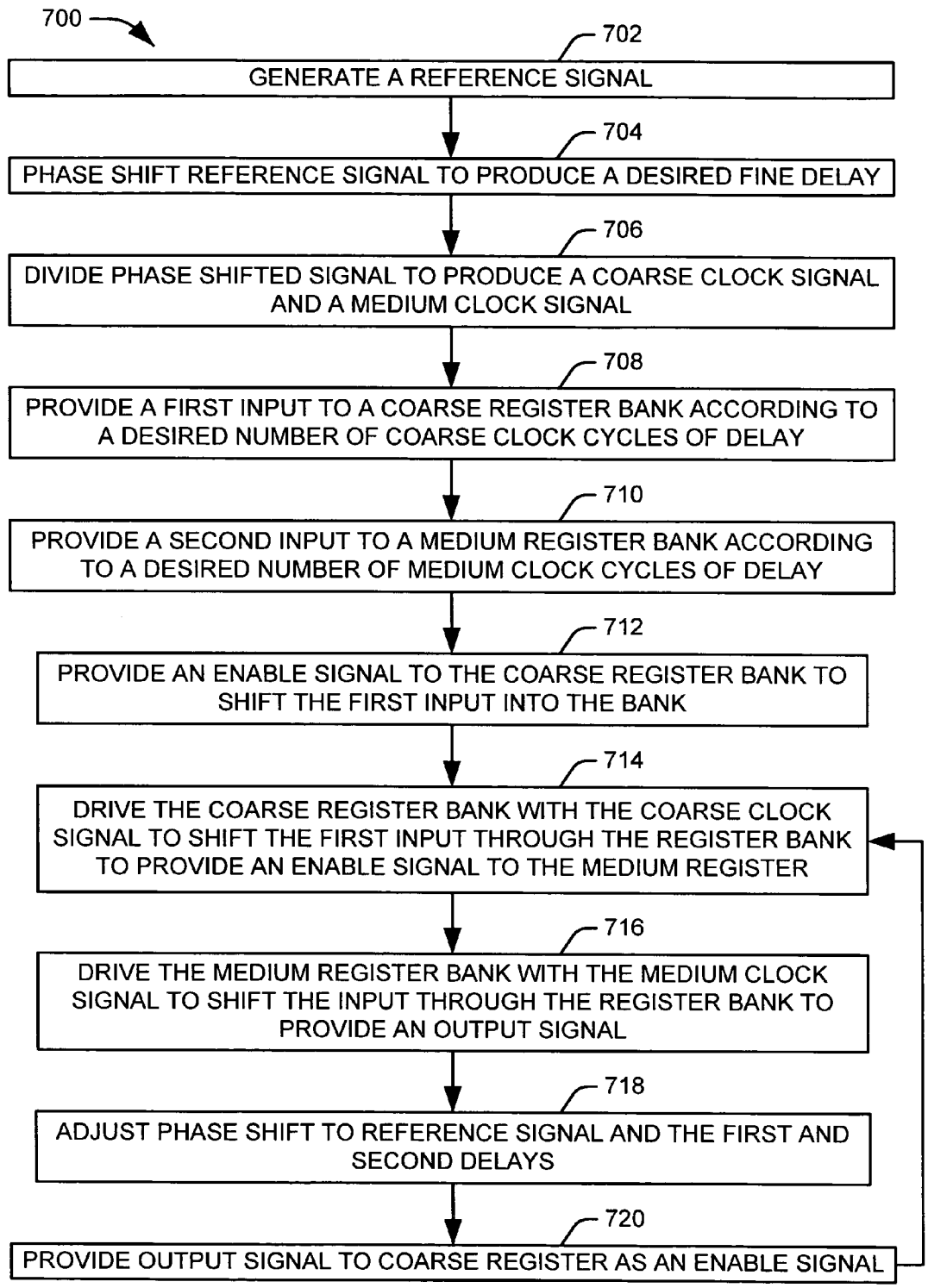
FIG. 7 illustrates a methodology for producing precision timing signals along a signal path in accordance with an aspect of the present invention.

Referring now to FIG. 7, there is illustrated a methodology 700 in accordance with an aspect of the present invention. While, for purposes of simplicity of explanation, a methodology is shown and described as executing serially, it is to be understood and appreciated that the present invention is not limited by the order shown, as some aspects may, in accordance with the present invention, occur in different orders and/or concurrently from that shown and described herein. Moreover, not all features shown or described may be needed to implement a methodology in accordance with the present invention. Additionally, such methodology can be implemented in hardware (e.g., one or more integrated circuits), software (e.g., running on a DSP or ASIC) or a combination of hardware and software.

The methodology 700 of FIG. 7 can be employed for providing a precise, programmable delay along a signal path. The methodology 700 begins at 702 where a reference clock signal is generated. At 704, a fine portion of a desired delay is applied to the clock signal in the form of a phase shift. The phase shift can vary, for example, from zero to one full clock cycle. The phase shifted signal is then divided at 706 to produce a coarse clock signal and a medium clock signal. As the name would indicate, the coarse clock signal has a low associated frequency (e.g., 75 MHz) relative to the frequency of the medium clock signal (e.g., 600 MHz). It will be appreciated that the coarse clock signal can be used across multiple signal paths, such that not every signal path will require such a signal.

At 708, a first input is provided to a coarse register bank. The input is provided to a register within the bank according to a desired number of coarse clock cycles of delay. For example, if the period of the coarse clock is about 13.3 nanoseconds and the total desired delay for the signal is about 100 nanoseconds, seven coarse clock cycles of delay would be desirable, providing a coarse delay of about 93.3 nanoseconds. Accordingly, the first input would be provided to a register spaced seven registers from the end of the bank such that the input would reach the final register after six coarse clock cycles once the register bank is enabled.

At 710, a second input is provided to a medium register bank. The input is provided to a register within the bank according to a desired number of medium clock cycles of delay. The medium bank, however, will generally contain a number of registers sufficient to delay a signal for one coarse clock cycle. For example, if the period of the coarse clock is about 13.3 nanoseconds and the period of the medium clock is about 1.67 nanoseconds, and the total desired delay for the signal is about 100 nanoseconds, the use of seven coarse clock cycles of delay would leave a necessary delay of about 6.67 nanoseconds, the equivalent of four cycles of the medium clock. Accordingly, the second input would be provided to a register four registers from the end of the bank such that the input would reach the final register after three medium clock cycles once the register bank is enabled. Any additional necessary delay can be provided via the phase shift in the reference signal described above.

At 712, the coarse register bank is provided with an enable signal and the first input is shifted into the register bank at the selected location. At 714, the first input is driven through the coarse register bank in the desired number of cycles of the coarse clock signal and is output as an enable signal to the medium register. At 716, the medium register bank receives the second input at the selected location in response to the enable signal. The input is driven through the medium register bank for the desired number of medium clock cycles and then provided as the output for the signal path.

At 718, the applied phase shift and the entry positions of the first and second inputs can be adjusted by a system control to provide a different delay for the next input. This can be performed prior to the output of the second input from the medium register. The new values essentially define a pulse repetition rate (PRR) for the signal path. At 720, the output signal is provided to the coarse register bank as an enable signal. The methodology 700 then returns 714 to produce another signal path output.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A precision timing system, comprising:
   a first register bank, driven by a first clock signal, that provides a first delay along a first signal path;
   a second register bank, driven by a second clock signal related to the first clock signal, that provides a second delay along a second signal path; and
   a system control that controls at least one of the first and second banks of registers to control the first and second delays, as to provide a desired skew between the output of the first signal path and the second signal path; wherein the first clock signal and the second clock signal having substantially the same frequency, and the second clock signal being phase shifted relative to the first clock signal to provide a fine range of delay to the system and further comprising:
   a third register bank, driven by a third clock signal, that provides a third delay along the first signal path for enabling the first delay by the first register bank, the third delay providing a coarser range of delay than the first delay; and
   a fourth register bank, driven by the third clock signal, that provides a fourth delay along the second signal path for enabling the second delay by the second register bank, the fourth delay providing a coarser range of delay than the second delay.

2. The system of claim 1, further comprising:
   a first multiplexer that controls loading registers of the first register bank to control the first delay based on a first control input from the system control; and
   a second multiplexer that controls loading registers of the second register bank to control the second delay based on a second control input from the system control.

3. The system of claim 1, the second register bank comprising a plurality of serially connected registers, each of the plurality of registers representing a delay equal to a period of the second clock signal, such that the second register bank is capable of providing the second delay within a range of delays functionally related to the period of the second clock signal and which of the plurality of serially connected registers is selected by the system control.

4. A radar system comprising the precision timing system of claim 1.

5. The system of claim 1, wherein the first signal path provides a signal at a pulse repetition rate, the system control operative to control the first and second register banks to produce a skew between the first and second signal paths in a range up to a skew that exceeds the pulse repetition rate of the first signal path.

6. A precision timing system, comprising:
   a first register bank, driven by a first clock signal, that provides a first delay along a first signal path;
   a second register bank, driven by a second clock signal related to the first clock signal, that provides a second delay along a second signal path; and
   a system control that controls at least one of the first and second banks of registers to control the first and second delays, as to provide a desired skew between the output of the first signal path and the second signal path; wherein the first clock signal and the second clock signal having substantially the same frequency, and the second clock signal being phase shifted relative to the first clock signal to provide a fine range of delay to the system,
   wherein the second register bank comprising a plurality of serially connected registers, each of the plurality of registers representing a delay equal to a period of the second clock signal, such that the second register bank is capable of providing the second delay within a range of delays functionally related to the period of the second clock signal and which of the plurality of serially connected registers is selected by the system control; and the second register bank further comprising a negative edge register that selectively provides a delay equal to one-half the period of the second clock signal based on a negative edge control input from the system control.

7. The system of claim 6, further comprising:
   a first phase interpolator that processes a signal from a reference clock to provide a desired phase in the first clock signal based on a first phase control input from the system control; and a second phase interpolator processing the signal from the reference clock to providing a desired phase in the second clock signal based on a second phase control input from the system control, the first and second phase interpolators being capable of imposing a one-half cycle delay between the first and second clock signals, with an additional one-half cycle delay being selectively implemented by the negative edge register base on the negative edge control input.

8. The system of claim 7, wherein a most significant bit of the second phase control input defines the negative edge control input.

9. A precision timing system, comprising:
a clock source that provides a first clock signal associated with a first signal path, a second clock signal associated with a second signal path, and a coarse clock signal;
a first medium register bank, driven by the first clock signal, that provides a pulse along the first signal path having a first delay relative to the first clock signal in response to a first enable signal;
a second medium register bank, driven by the second clock signal, that provides a pulse along the second signal path having a second delay relative to the second clock signal in response to a second enable signal;
a first coarse register bank, driven by the coarse clock signal, that provides the first enable signal to the first medium register bank with a third delay relative to the coarse clock signal;
a second coarse register bank, driven by the coarse clock signal, that provides the second enable signal to the second medium register bank with a fourth delay relative to the coarse clock signal; and
a system control that controls the first and second medium register banks and the first and second coarse register banks to define respective periods of the first, second, third, and fourth delays the clock source further comprising:
a first phase interpolator that processes a signal from a reference clock to provide a desired phase in the first clock signal based on a first phase control input from the system control; and
a second phase interpolator processing the signal from the reference clock to providing a desired phase in the second clock signal based on a second phase control input from the system control wherein relative phase difference between the first and second clock signals provides a fine range of delay for the system.

10. The system of claim 9, the clock source further comprising:
a first divider for processing a signal from a reference clock having a first frequency to produce the first clock signal at a second frequency which is a fractional part of the first frequency; and
a second divider for processing the signal from the reference clock to produce the second clock signal at the second frequency.

11. The system of claim 9, the first divider and the second divider being locked in phase as to maintain a constant phase shift between the first clock signal and the second clock signal.

12. The system of claim 11, further comprising:
a third multiplexer that controls the loading of the registers of the first coarse register bank to control the third delay based on a first coarse control input from the system control, the third delay providing a different range of incremental delay along the first signal path than the first delay; and a fourth multiplexer that controls the loading of the registers of the second coarse register bank to control the fourth delay based on a second coarse control input from the system control, the forth delay providing a different range of incremental delay along the second signal path than the second delay.

13. The system of claim 9, the second medium register bank further comprising a negative edge register that provides a delay equal to one-half the period of the second clock signal based on a negative phase control input from the system control.

14. The system of claim 9, wherein the first medium register bank further comprises a first multiplexer that controls the loading of registers of the first register bank to control the first delay based on a control input from the system control, and the second medium register bank further comprises a second multiplexer that controls the loading of registers of the second register bank to control the second delay based on a second control input from the system control.

15. The system of claim 9, wherein the first signal path provides an signal at a pulse repetition rate, the system control defining the first, second, third, and fourth delays to produce a skew between the first and second signal paths in a range up to a skew that exceeds the pulse repetition rate of the first signal path.

16. A precision timing system, comprising:
means for providing a first programmable delay on a first signal path;
means for providing a second programmable delay on a second signal path; and
means for controlling the first programmable delay and the second programmable delay, the means for controlling being operative to provide the second programmable delay in a range from no delay up to at least a duration of delay that is twice that of the first programmable delay wherein at least one clock signal comprises respective first and second clock signals, the means for generating further comprising:
means for shifting phase of the first clock signal;
means for shifting phase of the second clock signal, such that relative phase difference between the first and second clock signals provides a fine range of delay for the system;
means for providing a third programmable delay driven by a third clock signal, that provides the third programmable delay along the first signal path for enabling the first programmable delay by a first register bank, the third programmable delay providing a coarser range of delay than the first programmable delay; and
means for providing a fourth programmable delay driven by the third clock signal, that provides the fourth programmable delay along the second signal path for enabling the second programmable delay by a second register bank, the fourth programmable delay providing a coarser range of delay than the second programmable delay.

17. The system of claim 16, further comprising means for generating the at least one clock signal, the at least one clock signal being provided to the means for providing the first programmable delay and to the means for providing the second programmable delay, the at least one clock signal establishing a frequency for the outputs of the first and second signal paths.

18. The system of claim 16, further comprising means for dynamically programming the first and second programmable delays to provide a skew between signals at the outputs of the first and second signal paths that varies from zero to an amount that exceeds a pulse repetition rate for the first signal path.

19. A method for producing precision timing signals, comprising:
- providing a first input to a selected input of a plurality of inputs to a first bank of shift registers that form part of a first signal path to define a corresponding first delay;
- providing a second input to a selected input of a plurality of inputs to a second bank of shift registers that form part of a second signal path to define a corresponding second delay;
- driving the first bank of shift registers with a first signal clock to shift the first input through the first bank of shift registers to provide an output associated with the first signal path;
- driving the second bank of shift registers with a second signal clock, which is related to the first signal clock, to shift the second input through the second bank of shift registers to provide an output associated with the second signal path
- generating a third clock signal from the reference signal;
- providing a third input to a selected location of a third bank of shift registers that form part of the first signal path to define a corresponding third delay that is coarser than the first delay;
- providing a fourth input to a selected location of a fourth bank of shift registers that form part of the second signal path to define a corresponding fourth delay that is coarser than the second delay; and
- driving the third bank of shift registers with the third signal clock to shift the third input through the first bank of shift registers to provide an enable signal to the first bank of shift registers; and
- driving the fourth bank of shift registers with the third signal clock to shift the second input through the second bank of shift registers to provide an enable signal to the second bank of shift registers.

20. The method of claim 19, further comprising shifting a phase of the second clock signal relative to a phase of the first clock signal, such that the second clock signal lags the first clock signal by a desired phase.

21. The method of claim 19, further comprising dynamically programming the first, second, third and fourth delays to provide a skew between signals at the outputs of the first and second signal paths that varies from zero to an amount that exceeds a pulse repetition rate for the first signal path.

22. The method of claim 19, further comprising providing the respective outputs of the first and second signal paths as precision timing pulses to a spread spectrum radar.

* * * * *